(12) United States Patent
Jan et al.

(10) Patent No.: US 10,090,304 B2
(45) Date of Patent: Oct. 2, 2018

(54) ISOLATION WELL DOPING WITH SOLID-STATE DIFFUSION SOURCES FOR FINFET ARCHITECTURES

(71) Applicants: Walid M. Hafez, Portland, OR (US); Chia-Hong Jan, Portland, OR (US); Jeng-Ya D. Yeh, Portland, OR (US); Hsu-Yu Chang, Hillsboro, OR (US); Neville Dias, Hillsboro, OR (US); Chanaka Munasinghe, Hillsboro, OR (US)

(72) Inventors: Chia-Hong Jan, Portland, OR (US); Walid M Hafez, Portland, OR (US); Jeng-Ya David Yeh, Portland, OR (US); Hsu-Yu Chang, Hillsboro, OR (US); Neville L Dias, Hillsboro, OR (US); Chanaka D Munasinghe, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/914,614

(22) PCT Filed: Sep. 25, 2013

(86) PCT No.: PCT/US2013/061732
§ 371 (c)(1),
(2) Date: Feb. 25, 2016

(87) PCT Pub. No.: WO2015/047253
PCT Pub. Date: Apr. 2, 2015

(65) Prior Publication Data
US 2016/0211262 A1    Jul. 21, 2016

(51) Int. Cl.
*H01L 27/088* (2006.01)
*H01L 27/12* (2006.01)
(Continued)

(52) U.S. Cl.
CPC ...... *H01L 27/0924* (2013.01); *H01L 21/2256* (2013.01); *H01L 21/823814* (2013.01);
(Continued)

(58) Field of Classification Search
CPC ......... H01L 27/09; H01L 21/22; H01L 21/62; H01L 29/10; H01L 29/66; H01L 29/78
(Continued)

(56) References Cited

U.S. PATENT DOCUMENTS 6,475,890 B1 * 11/2002 Yu ..................... H01L 29/42384
257/E29.137
6,562,665 B1 * 5/2003 Yu ..................... H01L 29/42384
257/E29.137
(Continued)

FOREIGN PATENT DOCUMENTS

CN         1881614        12/2006
JP        2007201021        8/2007
(Continued)

OTHER PUBLICATIONS

International Preliminary Report on Patentability for International Patent Application No. PCT/US2013/061732 dated Apr. 7, 2016, 10 pages.
(Continued)

*Primary Examiner* — Sheikh Maruf
(74) *Attorney, Agent, or Firm* — Green, Howard & Mughal LLP

(57) ABSTRACT

An impurity source film is formed along a portion of a non-planar semiconductor fin structure. The impurity source film may serve as source of an impurity that becomes electrically active subsequent to diffusing from the source film into the semiconductor fin. In one embodiment, an impurity source film is disposed adjacent to a sidewall surface of a portion of a sub-fin region disposed between an
(Continued)

active region of the fin and the substrate and is more proximate to the substrate than to the active area. In further embodiments, the impurity source film may provide a source of dopant that renders the sub-fin region complementarily doped relative to a region of the substrate forming a P/N junction that is at least part of an isolation structure electrically isolating the active fin region from a region of the substrate.

18 Claims, 12 Drawing Sheets

(51) Int. Cl.
    *H01L 29/78*      (2006.01)
    *H01L 27/092*      (2006.01)
    *H01L 21/8238*      (2006.01)
    *H01L 29/66*      (2006.01)
    *H01L 21/225*      (2006.01)
    *H01L 29/06*      (2006.01)
    *H01L 29/08*      (2006.01)
    *H01L 29/10*      (2006.01)

(52) U.S. Cl.
    CPC ............... *H01L 21/823821* (2013.01); *H01L 21/823878* (2013.01); *H01L 21/823892* (2013.01); *H01L 27/0928* (2013.01); *H01L 29/0649* (2013.01); *H01L 29/0847* (2013.01); *H01L 29/1095* (2013.01); *H01L 29/66803* (2013.01); *H01L 29/7851* (2013.01)

(58) Field of Classification Search
    USPC ........ 257/401, 347, 412, 393, 392, E21.703, 257/E21.018
    See application file for complete search history.

(56) References Cited

U.S. PATENT DOCUMENTS

| | | | |
|---|---|---|---|
| 9,543,382 B1* | 1/2017 | Wu | H01L 27/0886 |
| 2003/0193058 A1* | 10/2003 | Fried | H01L 21/84 257/200 |
| 2004/0256683 A1* | 12/2004 | Lee | H01L 21/823412 257/412 |
| 2005/0161739 A1 | 7/2005 | Anderson et al. | |
| 2006/0244051 A1 | 11/2006 | Izumida et al. | |
| 2007/0134864 A1* | 6/2007 | Anderson | H01L 21/84 438/197 |
| 2008/0149984 A1* | 6/2008 | Chang | H01L 27/108 257/314 |
| 2008/0296632 A1* | 12/2008 | Moroz | H01L 21/823807 257/255 |
| 2009/0101978 A1* | 4/2009 | Anderson | H01L 29/66795 257/365 |
| 2010/0052059 A1* | 3/2010 | Lee | H01L 29/6659 257/368 |
| 2010/0183961 A1* | 7/2010 | Shieh | G03F 1/36 430/30 |
| 2010/0203734 A1* | 8/2010 | Shieh | H01L 21/3086 438/706 |
| 2010/0264468 A1* | 10/2010 | Xu | H01L 29/66795 257/288 |
| 2010/0264497 A1* | 10/2010 | Chang | H01L 29/66795 257/393 |
| 2011/0115031 A1* | 5/2011 | Park | H01L 27/105 257/401 |
| 2011/0129990 A1 | 6/2011 | Mandrekar et al. | |
| 2011/0171795 A1* | 7/2011 | Tsai | H01L 29/66795 438/232 |
| 2011/0278676 A1 | 11/2011 | Cheng et al. | |
| 2011/0317485 A1 | 12/2011 | Liaw et al. | |
| 2012/0012932 A1 | 1/2012 | Perng et al. | |
| 2012/0104472 A1 | 5/2012 | Xu et al. | |
| 2013/0043536 A1* | 2/2013 | Rahim | H01L 29/66795 257/347 |
| 2013/0043563 A1 | 2/2013 | Nakazawa | |
| 2013/0102137 A1 | 4/2013 | Jeng | |

FOREIGN PATENT DOCUMENTS

| | | |
|---|---|---|
| KR | 1020110025075 | 3/2011 |
| TW | 200905875 | 2/2009 |
| WO | 2005079182 | 9/2005 |
| WO | 2014204477 | 12/2014 |

OTHER PUBLICATIONS

International Search Report and Written Opinion for International Patent Application No. PCT/US2013/061732 dated Jun. 27, 2014, 13 pages.
Notice of Allowance for Taiwan Patent Application No. 103129556 dated Mar. 24, 2016, 2 pages (No Translation Available).
Office Action and Search Report for Taiwan Patent Application No. 103129556 dated Dec. 16, 2015, 14 pages.
Extended European Search Report dated Jul. 5, 2017 for European Patent Application No. 17 161 293.0.
Extended European Search Report for European Patent Application No. 13894211.5 dated Mar. 31, 2017, 8 pages.
Non-Final Office Action from U.S. Appl. No. 15/409,435 notified Mar. 26, 2018, 17 pgs.
Non-Final Office Action from Chinese Patent Application No. 201380079126.6 notified dated May 3, 2018, 16 pgs.

* cited by examiner

ISOLATION WELL DOPING WITH SOLID-STATE DIFFUSION SOURCES FOR FINFET ARCHITECTURES

TECHNICAL FIELD

Embodiments of the invention generally relate to integrated circuits (ICs), and more particularly pertain to well impurity doping of FinFETs.

BACKGROUND

Monolithic ICs generally comprise a number of transistors, such as metal-oxide-semiconductor field-effect transistors (MOSFETs) fabricated over a planar substrate, such as a silicon wafer. System-on-a-chip (SoC) architectures utilize transistors in both analog and digital circuitry. Monolithic integration of high-speed analog and digital circuitry can be problematic, in part, because digital switching can induce substrate noise that can limit precision and linearity of analog circuitry. Greater substrate isolation is therefore advantageous for improved SoC performance.

FIG. 1A illustrates an arrangement of a monolithic device structure 101 that may be employed to measure substrate isolation between a first port (Port 1) and a second port (Port 2). Generally, a signal $S_1$ is applied to Port 1 and strength of a corresponding noise signal $S_2$ is measured at Port 2 with isolation defined as the ratio of the two signal strengths ($S_2/S_1$). Guard ring structures, such as guard ring 110, and well isolation structures, such as deep well 120, may be provided to improve substrate isolation. As shown, guard ring 110 forms P/N/P impurity type regions ensuring a reversed diode surrounds any noise sensitive circuitry (e.g., one or more transistors of analog circuitry). Such guard ring structures may improve isolation by 20 dB, or more. Substrate isolation can be further improved with the exemplary deep well 120, which includes an n-type region disposed below a p-well (e.g., in which n-type transistors might be disposed) within guard ring 110. The n-type regions of guard ring 110 and deep well 120 may be made continuous, as often found in a triple-well process, to further improve substrate isolation between Ports 1 and 2. Such deep well isolations may improve isolation by 35 dB, or more, relative to a guard ring structure alone.

Deep well structures are typically fabricated through ion implantation, for example with a high-energy phosphorus implant for an n-well. High energy is required to achieve sufficient well depth, which may be hundreds of nanometers below a top surface of the substrate, particularly where the overlying active device silicon has a non-planar (e.g., finFET) architecture 102, as depicted in FIG. 1B. Such implant processes however can damage overlying active device silicon 150 and are also associated with implanted species concentration profiles that can be a limiter of device scaling.

Device structures and techniques for well doping which offer good isolation and are amenable to non-planar device architectures would therefore be advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
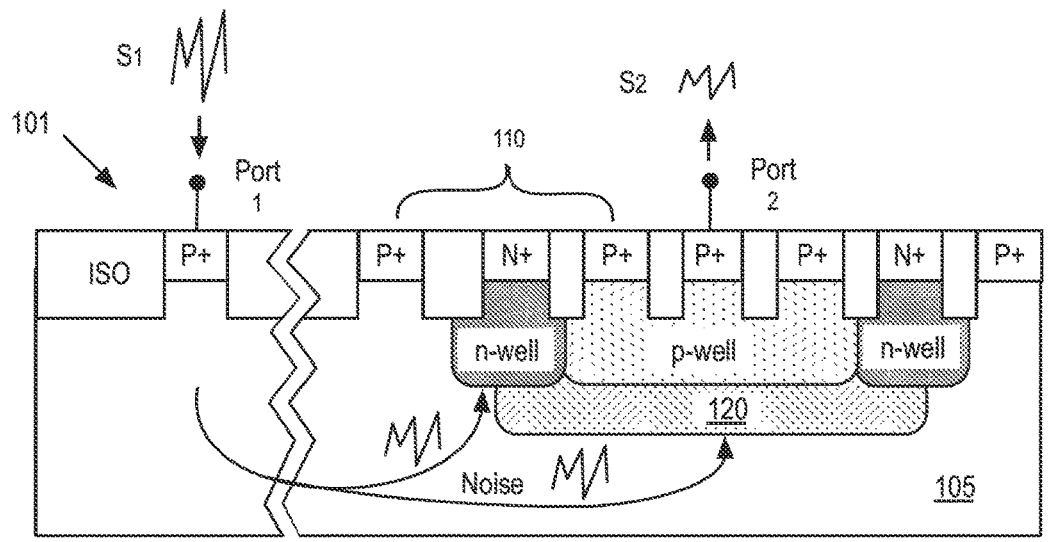
FIG. 1A is a cross-sectional view of a conventional structure for assessing a level of isolation between to two regions in of a monolithic semiconductor device.
Figure 1B:
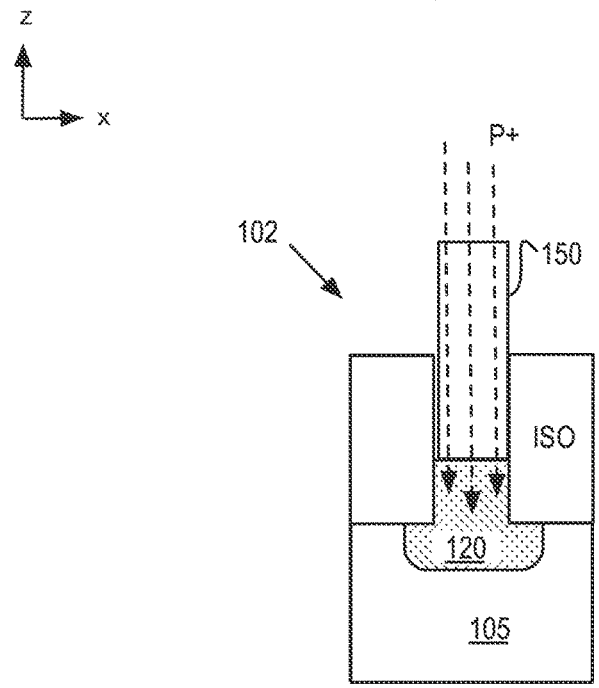
FIG. 1B is a cross-sectional view of a conventional structure depicting convention implantation technique for forming an isolation well in a sub-fin region of a monolithic semiconductor device.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As will be described in greater detail below, at least one impurity source film is formed along a portion of a non-planar semiconductor fin structure. The impurity source film may serve as a source of at least one type of impurity that becomes electrically active subsequent to diffusing from the source film into the semiconductor fin. In one such embodiment, an impurity source film is disposed adjacent to a sidewall surface of a portion of a sub-fin region disposed between an active region of the fin and the substrate and is more proximate to the substrate than to the active area. In further embodiments, the impurity source film may provide a source of dopant that renders the sub-fin region complementarily doped relative to a region of the substrate forming a P/N junction that is at least part of an isolation structure electrically isolating the active fin region from a region of the substrate.

As will also be described in greater detail below, an integrated microelectronic device having a finFET architecture may rely on solid-state diffusion sources where an impurity source film is formed adjacent to a sidewall of a portion of a sub-fin region proximate to substrate. A second film may be formed over the impurity source film to be adjacent to a sidewall of a portion of the sub-fin region more proximate to the active region than to the substrate. The second film may be an undoped isolation dielectric or a second impurity source film. Dopants are driven from the impurity source film(s) into the portions of the sub-fin region proximate to the source films. A gate stack and source/drain are then formed for the active region of the fin.

Figure 2A:
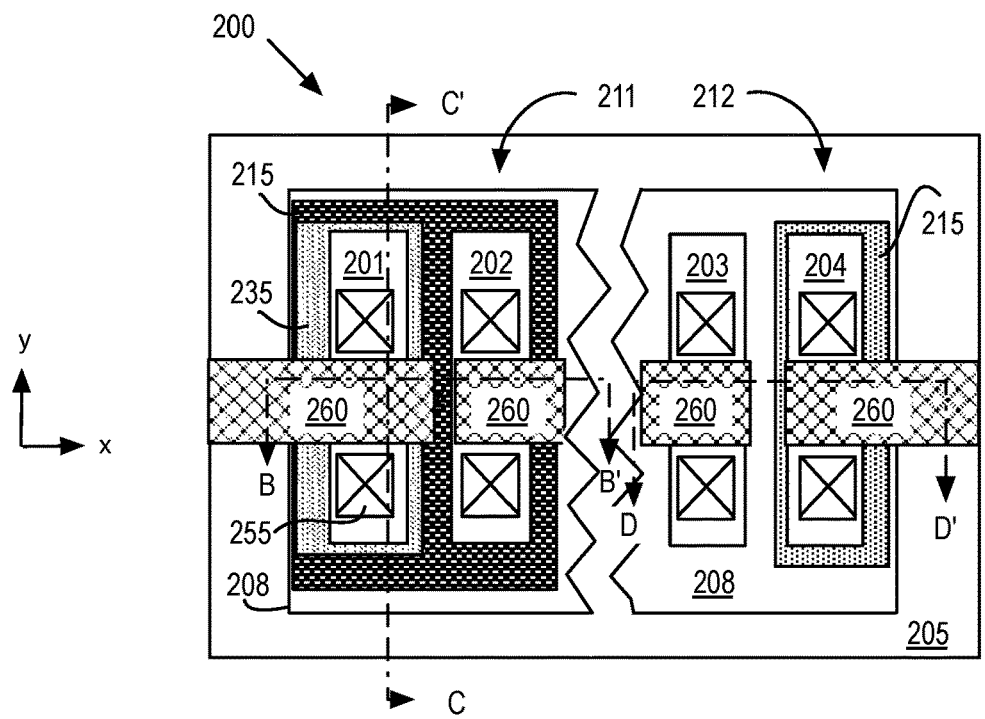
FIG. 2A is a plan view of an integrated microelectronic device having a finFET architecture with solid-state diffusion sources for isolation well doping, in accordance with an embodiment.

In embodiments, an integrated microelectronic device includes a substrate and a plurality of transistors disposed on the substrate. At least one transistor includes a non-planar semiconductor fin extending from the substrate (i.e., a finFET). FIG. 2A is a plan view of an integrated microelectronic device 200 having transistors with a finFET architecture and relying, at least in part, on solid-state diffusion for isolation well doping, in accordance with an embodiment. Microelectronic device 200 is disposed on substrate 205, which may be any substrate known in the art to be suitable for forming an IC, such as, but not limited to, a semiconductor substrate, semiconductor-on-insulator (SOI) substrate, or an insulator substrate (e.g., sapphire), the like, and/or combinations thereof. In one exemplary embodiment, substrate 205 comprises a substantially monocrystalline semiconductor, such as, but not limited to, silicon. While substrate 205 may be of either n-type or p-type conductivity, in the exemplary embodiment substrate 205 has p-type conductivity and may include a resistive p-type silicon epitaxial layer disposed on a non-intentionally doped silicon substrate. Extending from first substrate region 211 are non-planar semiconductor bodies, or "fins" 201, 202 and extending from second substrate region 212 are fins 203, and 204. Fins 201-204 are advantageously substantially monocrystalline, and have the same crystal orientation as substrate 205. Polycrystalline fin embodiments are however also possible as embodiments of the invention are not notably limited by either the microstructure or composition of fins 201-204. Fins 201-204 may all have the same semiconductor compositions or differ between them. Furthermore, one or more fin may comprise an epitaxial layered structure or be of a homogeneous semiconductor. Exemplary semiconductor compositions include group IV systems, such as silicon, germanium, or an alloy thereof, or group III-V systems, such as GaAs, InP, InGaAs, and the like, or group III-N systems, such as GaN. Within each substrate region 211, 212 an isolation dielectric 208 is disposed between fins 201-204. Isolation dielectric 208 may have any conventional composition, such as, but not limited to, one or more layers of one or more of silicon dioxide, silicon oxynitride, or silicon nitride.

Figure 2B:
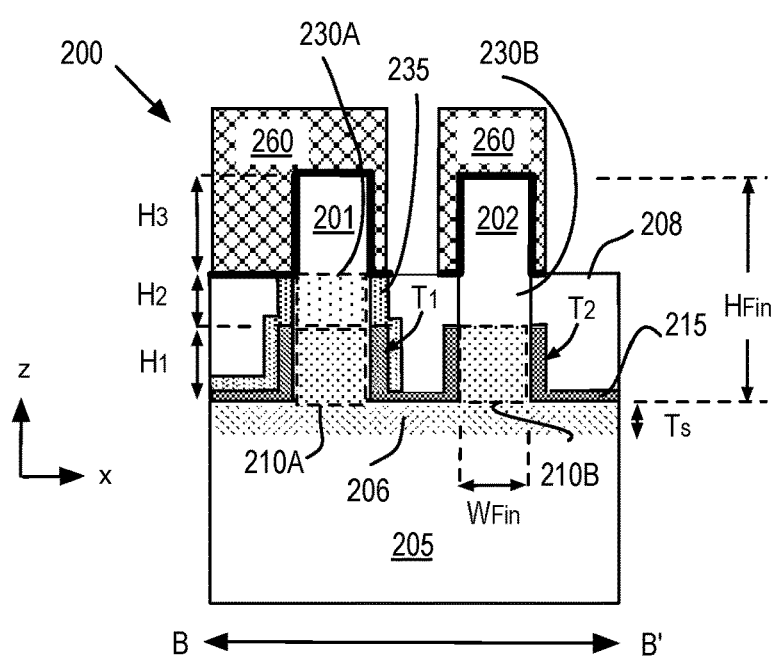
FIG. 2B is a cross-sectional view along the B-B' plane depicted in the integrated microelectronic device of FIG. 2A, in accordance with an embodiment.
Figure 2C:
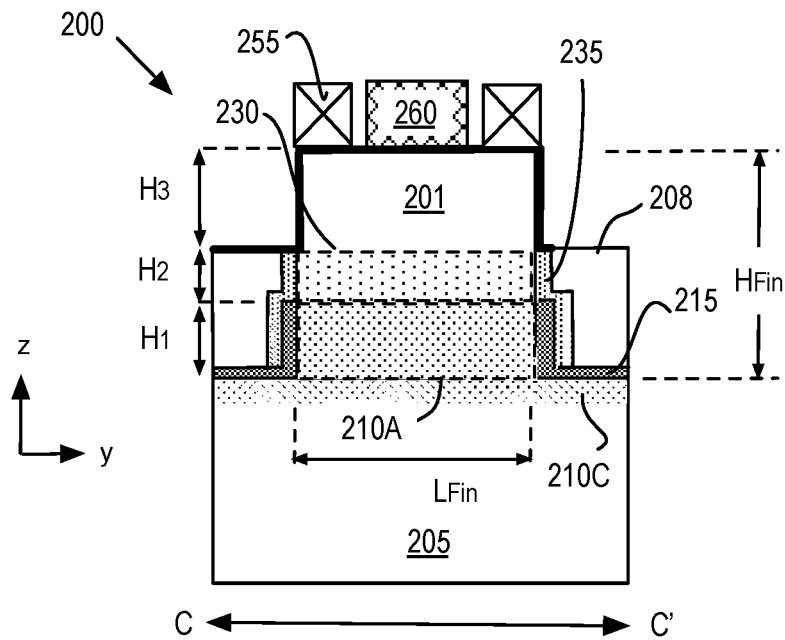
FIG. 2C is a cross-sectional view along the C-C' plane depicted in the integrated microelectronic device of FIG. 2A, in accordance with an embodiment.

As illustrated in FIGS. 2B and 2C, fins 201 and 202 are of a same, homogeneous semiconductor. For such embodiments where substrate 205 is substantially monocrystalline silicon, fins 201-202 are substantially monocrystalline silicon that is contiguous with substrate 205 (i.e., no intervening layer of distinct material composition). Fins 201-204 may take a wide variety of structural forms and dimensions. In the exemplary embodiment, fins 201, 202 include sidewall surfaces that are non-parallel (e.g., along a y-z plane in FIG. 2B and an x-z plane in FIG. 2C) to plane of the substrate surface (e.g., along an x-y plane) and a top surface that may be rounded or may be substantially planar with a top surface of the substrate. In certain embodiments, fins 201, 202 have a lateral fin width ($W_{fin}$) less than 50 nm, advantageously less than 30 nm, and more advantageously less than 20 nm. In certain such embodiments, fins 201, 202 further extend from substrate 205 by a vertical height ($H_{fin}$) that is less than 200 nm, advantageously less than 150 nm, and more advantageously between 20 nm and 150 nm. A length of fins 201, 202 ($L_{fin}$ in FIG. 2C) is arbitrary as a function of process capability and parametric requirements, etc. Fins 203-204 may have substantially the same fin dimensions as fins 201, 202.

In embodiments, semiconductor fins include an active region where the transistor channel and source/drain semiconductor resides. As shown in FIGS. 2B and 2C, fins 201, 202 are divided into portions along the z-height of the fin, each portion have a z-height less than the total fin height $H_{fin}$. The active region of fins 201, 202 is associated with an incremental fin sidewall height $H_3$. Electrically coupled to the active fin region is a gate stack 260, which for example includes a gate dielectric (e.g., silicon dioxide, and/or silicon nitride, and/or silicon oxynitride, and/or a higher-K material like $HfO_2$, or the like), and a gate electrode, which may be any conventional material, such as, but not limited to, polysilicon and/or one or more metals. On opposite sides of gate stack 260 are source/drain contacts 255 coupling to source/drain semiconductor regions of fins 201-204.

In embodiments, a semiconductor fin further includes a sub-fin region disposed between the active region of the fin and the substrate. In embodiments, at least a portion of sub-fin region is doped with one or more electrically active impurity. For fin 201, the sub-fin region includes a lower sub-fin region 210A proximate to substrate 205 and associated with an incremental fin sidewall height $H_1$. Fin 202, includes an analogous lower sub-fin region 210B. In the exemplary embodiment, lower sub-fin regions 210A, 210B are impurity doped with one or more electrically active impurity, such as but not limited to phosphorus, arsenic (n-type dopants of silicon) and boron (p-type dopant of silicon), although any conventional dopant species may be selected depending on the semiconductor material system (e.g., aluminum for GaN systems, etc.). In further embodiments, lower sub-fin regions 210A, 210B have substantially the same impurity and impurity concentration. In exemplary silicon fin embodiments, lower sub-fin regions 210A, 210B have an impurity concentration of between $10^{17}$ cm$^{-3}$ and $10^{19}$ cm$^{-3}$. In one such embodiment, lower sub-fin regions 210A, 210B have a conductivity type opposite that of substrate 205. For example, where substrate 205 is p-type, the lower sub-fin regions 210A, 210B are n-type (e.g., with phosphorus impurity between $10^{17}$ cm$^{-3}$ and $10^{19}$ cm$^{-3}$). As such, lower sub-fin regions 210A, 210B may function as a deep counter-doped "well" (e.g., an n-well) providing isolation to overlying active region of the fins 201, 202.

In embodiments, a surface layer of the substrate between two impurity doped lower sub-fin regions is also impurity doped distinctly from a sub-surface region of substrate that is disposed below the substrate surface layer. Referring to FIG. 2B, substrate surface layer 206 has substantially the same impurity dopant concentration as sub-regions 210A, 210B (e.g., $10^{17}$ cm$^{-3}$-$10^{19}$ cm$^{-3}$). In further embodiments, the thickness of substrate surface layer 206 ($T_s$) is no greater than the lateral width ($W_{fin}$) of semiconductor fins 201, 202, and is advantageously between 50% and 100% of $W_{fin}$. As further illustrated in FIGS. 2A and 2D, surface layer 206 is absent from substrate region 212 and therefore is present between only a subset of fins 201-204.

In embodiments, an integrated microelectronic device includes a first impurity source film disposed adjacent to a sidewall surface of the lower sub-fin region. For such embodiments, the impurity source film may be utilized as a source of impurities for doping the lower sub-fin region by solid-state diffusion. As shown in FIG. 2A, a first impurity source film 215 is disposed adjacent to opposing sidewalls of fins 201, 202, and more specifically in direct contact with fin semiconductor. In other embodiments however, an intervening material layer may be disposed between an impurity source film and fin semiconductor. Impurity source film 215 extends from a top surface of substrate 205 to approximately $H_1$, which may range from the only the thickness of impurity source film 215 (e.g., 1-5 nm) up through an arbitrarily high percentage of the fin height $H_{fin}$.

As further shown in FIG. 2B, impurity source film 215 is further disposed over (e.g., in direct contact with) substrate surface layer 206. Impurity source film 215 may have a wide range of thicknesses, but in exemplary embodiments where $W_{fin}$ is less than 20 nm, impurity source film 215 is less than 10 nm, advantageously less than 7 nm, and more advantageously between 1 nm and 5 nm, as measured normal to the fin sidewall (e.g., $T_1$ in FIG. 2B). In further embodiments, impurity source film 215 disposed over substrate surface layer 206 has substantially the same thickness as along a fin sidewall (i.e., impurity source film 215 has a substantially conformal thickness of $T_1$).

Impurity source film 215 is doped with the electrically impurity present within the lower sub-fin region, such as, but not limited to, phosphorus, arsenic (n-type dopants of silicon) and boron (p-type dopant of silicon). In further embodiments, impurity source film 215 is an insulative dielectric thin film, such as but not limited to, impurity doped glasses. In certain such embodiments, impurity source film 215 is a boron-doped silicate glass (BSG), or phosphorus-doped silicate glass (PSG). Other options include a doped nitride, doped metallic film, doped semiconductor film, and the like. In an exemplary embodiment where substrate 205 is substantially p-type silicon, impurity source film 215 is doped with an impurity, such as phosphorus, that renders the lower sub-fin region n-type with a phosphorus impurity concentration of between $10^{17}$ cm$^{-3}$ and $10^{19}$ cm$^{-3}$. Impurity source film 215 therefore has a sufficiently high as-deposited impurity concentration and film thickness to provide the desired impurity concentration within the lower sub-fin region. As one example, the impurity source film 215 is a 1-5 nm thick PSG film doped with phosphorus to $10^{20}$-$10^{21}$ cm$^{-3}$ and in direct contact with sidewalls of the fins 201, 202.

In embodiments, the sub-fin region further includes an upper sub-fin region proximate to the active region and associated with an incremental fin sidewall height $H_2$. With the total sub-fin sidewall height corresponding to $H_1+H_2$, the proportioning of the sub-fin into the upper and lower regions may be varied through processing of the impurity source films (e.g., 215) to provide the desired vertical spacing between a lower sub-fin region and active region. $H_1$ and $H_2$ may vary widely within the confines of both being non-zero. The limit of $H_1=0$ is represented in a finFET employing fin 203 in FIG. 2D and the limit of $H_2=0$ is represented in a finFET employing fin 204 in FIG. 2D, described further elsewhere herein.

As shown in FIG. 2B, impurity source film 215 is absent from the sidewall surfaces of the upper sub-fin regions 230A, 230B, with at least one of an isolation dielectric 208 or a second impurity source film 235 disposed over impurity source film 215 and/or adjacent to the sidewall surfaces of the upper sub-fin regions of fins 201, 202 (the isolation dielectric 208 is depicted as transparent in FIG. 2A to fully reveal impurity source films 215, 235). Where a second impurity source film is adjacent to the sidewall surfaces, as for the upper sub-fin region 230A, the upper sub-fin region is impurity doped with an impurity present in the second impurity source film. If an isolation dielectric is adjacent to the sidewall surface, as for the upper sub-fin region 230B, the upper sub-fin region may be substantially undoped where the isolation dielectric is advantageously substantially free of the impurity present in first impurity source film 215 (as well as substantially free of the impurity present in second impurity source film 235). Although not depicted, a substantially undoped capping dielectric layer, such as silicon nitride, or the like, may be disposed between impurity source film 215 and impurity source film 235, and may serve to limit intermixing of dopants between the impurity source films 215 and 235 in regions where the impurity source film 235 is in contact with the impurity source film 215.

Impurity source film 235 may serve as a solid-state diffusion dopant source of an impurity, such as, but not limited to, phosphorus, arsenic, or boron. In an embodiment, upper sub-fin region 230A, and the second impurity source film 235 adjacent to sidewall surfaces of upper sub-fin region 230A, are doped with a second impurity that gives upper sub-fin region 230A a conductivity type complementary to that of lower sub-fin region 210A. Upper sub-fin doping may further render upper sub-fin region 230A doped distinctly from the overlying active fin region. As one example, upper sub-fin region 230A is p-type when lower sub-fin region 210A is n-type. Upper sub-fin region 230A may be doped with an impurity concentration of between $10^{17}$ cm$^{-3}$ and $10^{19}$ cm$^{-3}$. Upper sub-fin doping may serve one or more electrical functions, including a well-doping needed for a particular MOS structure as a function of the conductivity type of substrate 205; for threshold voltage tuning; or in furtherance of an isolation structure (e.g., to ensure a reverse diode is present between the fin active region and the substrate). In the exemplary embodiment depicted in FIGS. 2A and 2B, fin 201, with the associated doped sub-fin regions 210A and 230A, forms a portion of a substrate-isolated NMOS transistor. Fin 202, with the associated doped sub-fin regions 210B and 230B, forms a portion of a substrate-isolated PMOS transistor. FIGS. 2A and 2B therefore illustrate finFET structures present in a monolithic CMOS circuit that may be implemented in an wide variety of integrated microelectronic devices.

In further embodiments, impurity source film 235 includes any of the materials previously described as options for the impurity source film 215. In certain such embodiments, impurity source film 235 is a same material as that of impurity source film 215, but complementarily doped. For example, impurity source film 235 may be a doped insulative dielectric thin film, such as but not limited to, impurity doped glasses. In certain such embodiments, impurity source film 235 is a boron-doped silicate glass (BSG), or a phosphorus-doped silicate glass (PSG). Other options include a doped nitride, doped metallic film, doped semiconductor film, and the like. In an exemplary embodiment where substrate 205 is substantially p-type silicon, and impurity source film 215 is PSG, impurity source film 235 is silicate glass doped with an impurity, such as boron, that renders the upper sub-fin region 230A p-type with a boron impurity concentration of between $10^{17}$ cm$^{-3}$ and $10^{19}$ cm$^{-3}$. Impurity source film 235 therefore has a sufficiently high as-deposited impurity concentration and film thickness to provide the desired impurity concentration within upper sub-fin region 230A. Impurity source film 235 may have any thickness within the range previously described for impurity source film 215. In an embodiment for example, the impurity source film 235 is a 1-5 nm thick BSG film doped with boron to $10^{20}$-$10^{21}$ cm$^{-3}$ and in direct contact with sidewalls of the fins 201, 202 over the height $H_2$. In the exemplary embodiment illustrated in FIG. 2B, in regions where second impurity source film 235 is disposed over impurity source film 215, impurity source film 215 has a first sidewall thickness of $T_1$ that is greater than a second sidewall thickness $T_2$ in regions where isolation dielectric 208 is disposed over impurity source film 215 (i.e., where impurity source film 235 is absent).

In embodiments having a second impurity source film, isolation dielectric is disposed over both the first and the second impurity source and may further backfill any spaces between sub-fin regions of adjacent semiconductor fins. As shown in FIG. 2B for example, isolation dielectric 208 is disposed over impurity films 215 and 235 with a top surface of isolation dielectric 208 being planar with impurity film 235 to define the active region of fins 201, 202 as substantially equal to each other (e.g., having a height $H_3$). Although not depicted, in certain embodiments isolation dielectric 208 may include multiple layers, such as a silicon nitride liner, or the like, disposed in contact with one or more of impurity source films 215 and 235, which may serve to limit outward-diffusion of dopants from the impurity source films.

Figure 2D:
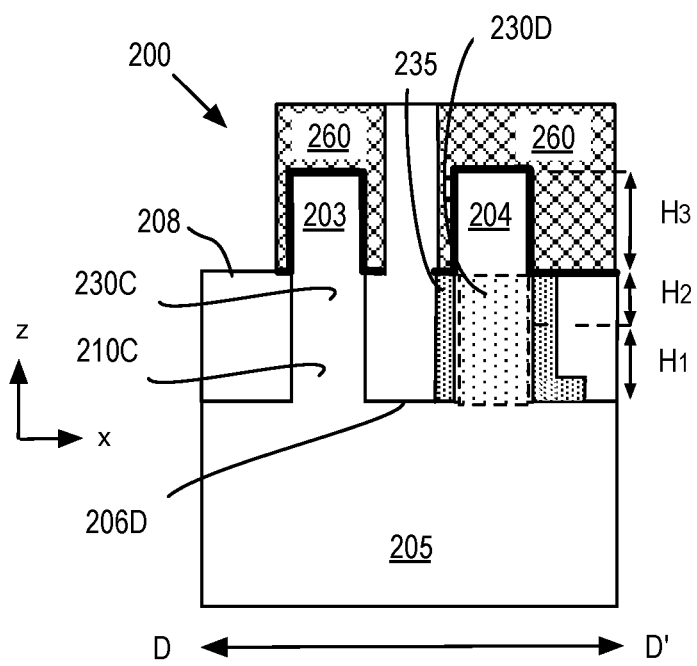
FIG. 2D is a cross-sectional view along the D-D' plane depicted in the integrated microelectronic device of FIG. 2A, in accordance with an embodiment.

In embodiments, additional transistors disposed on the substrate similarly include a semiconductor fin with upper and lower sub-fin regions, however the upper and lower sub-fin regions are not complementarily doped, may be doped uniformly, or neither the upper sub-fin region, nor lower sub-fin region has an impurity doping deviating significantly from that of the substrate. Such transistors that lack any doping distinction between upper and lower sub-fin regions may lack any substrate isolation junction, but remain useful, for example, in digital circuitry that is insensitive to substrate-coupled noise sources. Embodiments having some transistors with substrate isolation and others without substrate isolation may be found in certain SoC implementations. As illustrated by FIGS. 2A and 2D for example, with both impurity source films 215 and 235 being absent from sidewall surfaces of semiconductor fin 203, both lower sub-fin region 210C and upper sub-fin region 230C is of semiconductor substantially identical to that of substrate 205. Similarly, substrate surface layer 210D has the conductivity the substrate 205 (e.g. p-type). With these structural features, fin 203 may form a portion of a non-substrate-isolated PMOS transistor, for example. Impurity source film 235 is however disposed adjacent to fin 204 and therefore upper sub-fin region 230D may have a well-type doping (e.g., p-type) substantially the same as that of upper sub-fin region 230A. Fin 204 may therefore form a portion of a non-substrate-isolated NMOS transistor, for example. FIGS. 2A and 2B therefore illustrate finFET structures present in a monolithic CMOS circuit that may be implemented in a wide variety of mixed signal (analog and digital circuitry) integrated microelectronic devices, such as a SoC. In the embodiment depicted in FIG. 2D lower sub-fin region 210D is doped substantially the same as upper sub-fin region 230D (e.g., both p-type) because impurity source 215 extends over the entire sub-fin sidewall height $H_1+H_2$.

Figure 3:
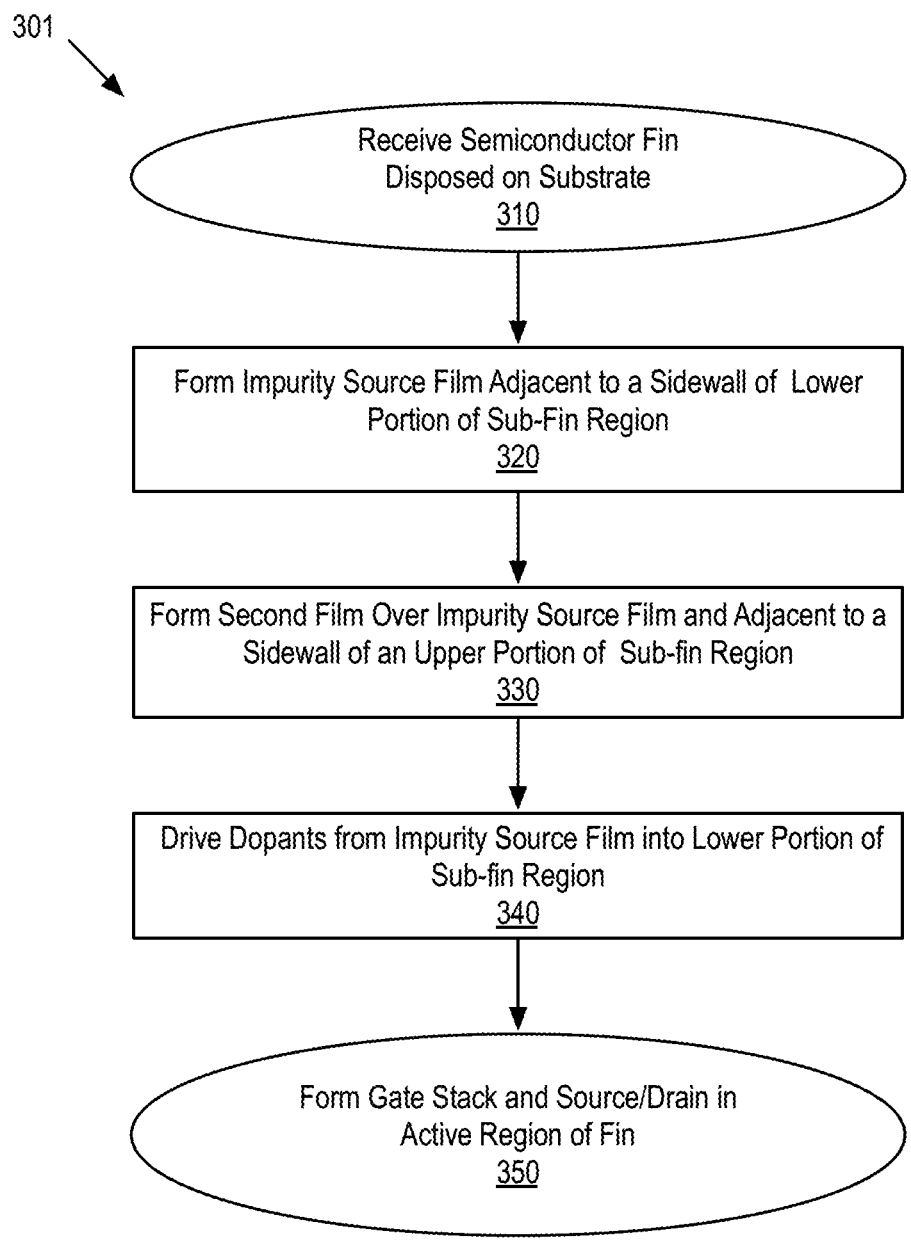
FIG. 3 is a flow diagram illustrating methods of forming an integrated microelectronic device having a finFET architecture with solid-state diffusion sources for isolation well doping, in accordance with embodiments.

With a number of structural elements associated with exemplary finFET well dopings by solid-state diffusion sources now described in detail, methods of fabricating such structures are further described in reference to the flow diagram in FIG. 3. In the illustrated implementation, process 301 may include one or more operations, functions or actions as illustrated by one or more of operations 310, 320, 330, 340, and/or 350. However, embodiments herein may include any number of operations such that some may be skipped. Further, various embodiments may include additional operations not shown for the sake of clarity.

The exemplary method 301 begins at operation 310 with receipt of a substrate having semiconductor fin disposed thereon. For example, a substrate with each of the fins 201-204 depicted in FIG. 2A may be received as an input starting material. As such fin structures may have been formed by any conventional means, no further description of their fabrication is provided herein.

Method 301 proceeds to operation 320 where an impurity source film is formed adjacent to a sidewall of only a lower portion of the sub-fin region of at least one of the semiconductor fins. At operation 330 then, a film is formed adjacent to a sidewall of an upper portion of a sub-fin region for at least one of the fins. This second film may either be a second impurity source film or an isolation dielectric film that is substantially undoped, or at least lacks sufficient electrically active impurities to significantly alter the doping of an upper portion of the sub-fin region relative to the condition received at operation 310.

At operation 340, dopants from at least the impurity source film deposited at operation 320 are driven into the lower portion of the sub-fin region, for example to form a substrate-isolative junction. Any thermal process such as a furnace drive or rapid thermal anneal may be performed to achieve sufficient solid-state diffusion that impurities present in the impurity source film permeate the entire lateral thickness of the fin within the lower sub-fin region without diffusing far up into the upper portion of the sub-fin region (e.g., by not more than the lateral fin thickness, which may be 20-30 nm, or less). Method 301 then completes with the formation of conventional aspects of a device utilizing the active region of the fin disposed over the sub-fin region. In the exemplary embodiment, a gate stack and source/drains are formed to complete a MOS transistor structure using any techniques conventional in the art.

Figure 4:
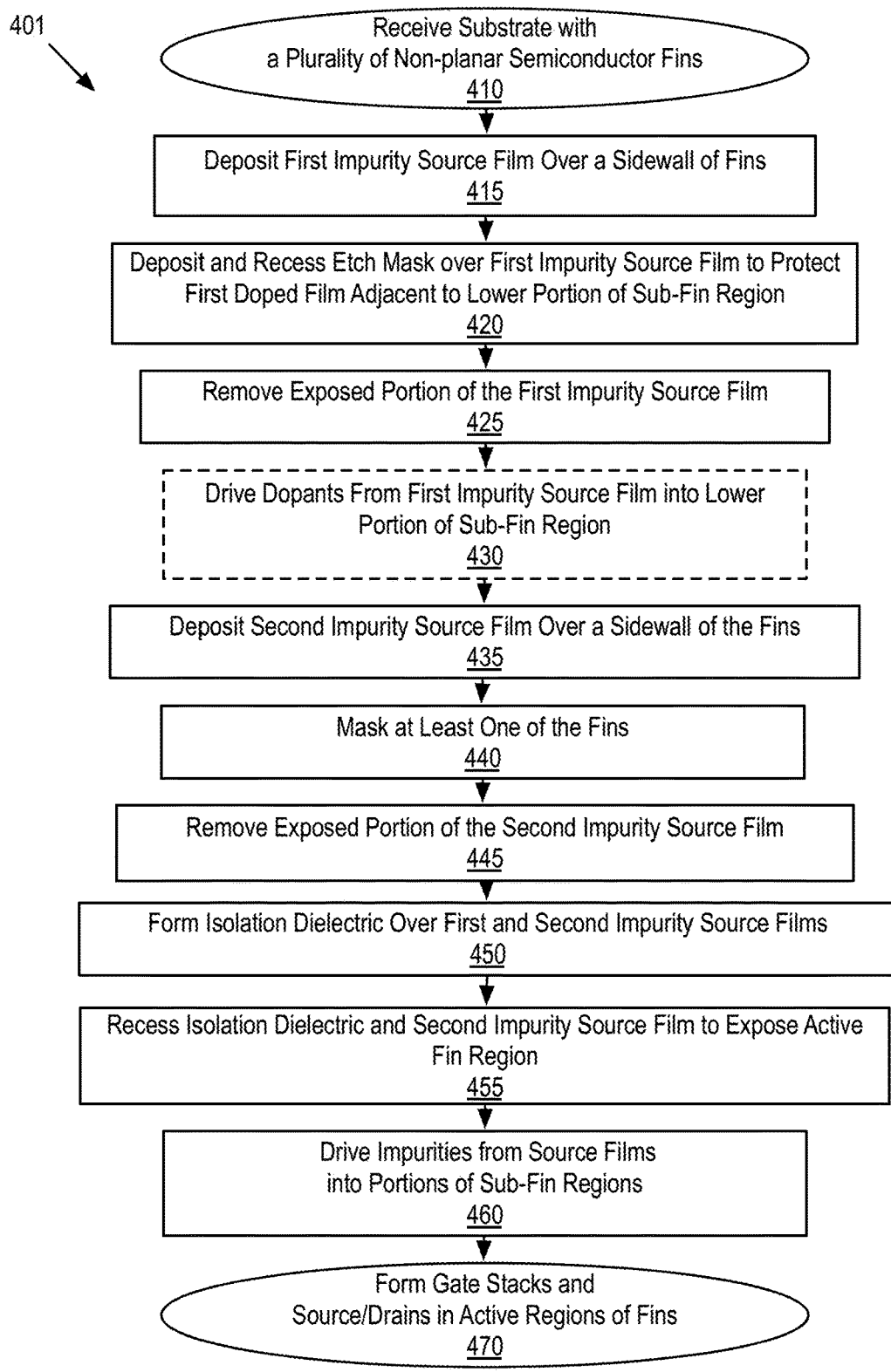
FIG. 4 is a flow diagram further illustrating methods of forming an integrated microelectronic device having a finFET architecture with multiple solid-state diffusion sources for well doping, in accordance with embodiments.

FIG. 4 is a flow diagram further illustrating methods of forming an integrated microelectronic device having a finFET architecture with multiple solid-state diffusion sources for well doping, in accordance with embodiments. Embodiments herein may include any number of operations such that some may be skipped. Further, various embodiments may include additional operations not shown for the sake of clarity. Such methods may, for example, be utilized to form one or more of the structures depicted FIGS. 5A, 5B, 5C, 5D, 5E, 5F, 5G, 5H, 5I, and 5J, which are cross-sectional views of an evolving finFET as particular fabrication operations illustrated in FIG. 4 are performed to ultimately arrive at the architecture illustrated in FIGS. 2A-2D, in accordance with an embodiment.

Figure 5A:
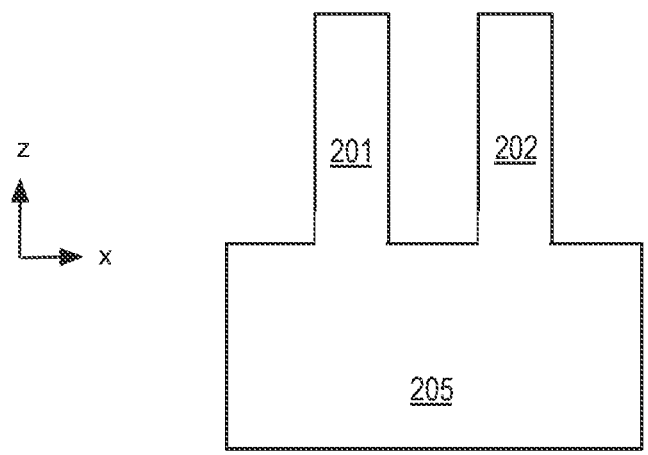
FIGS. 5A, 5B, 5C, 5D, 5E, 5F, 5G, 5H, 5I, and 5J are cross-sectional views of an evolving finFET as particular fabrication operations illustrated in FIG. 4 are performed to arrive at the architecture illustrated in FIG. 2A, in accordance with an embodiment.
Figure 5B:
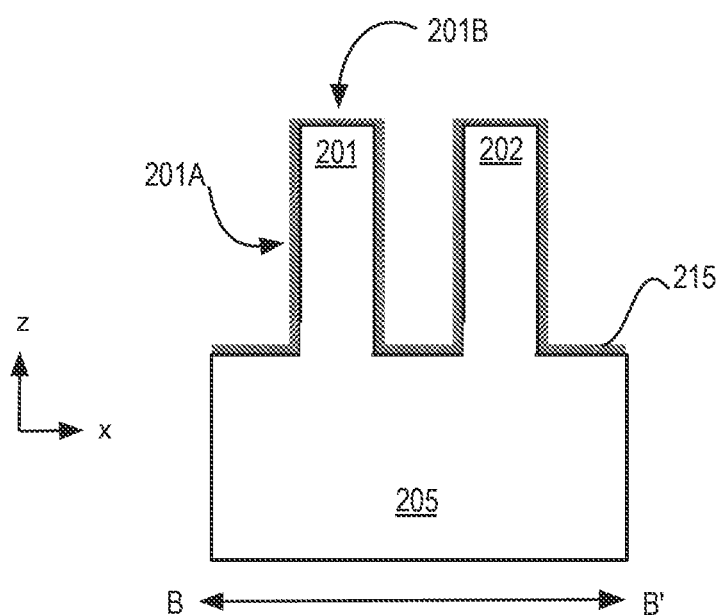

The exemplary method 401 begins at operation 410 with receiving a substrate having a plurality of semiconductor fins. An exemplary structure as received at operation 410 is illustrated in FIG. 5A. Any of the substrates and fin structures described elsewhere herein in the context of FIGS. 2A-2D may be received at operation 410 as an input starting material. At operation 415, the first impurity source film is deposited over a sidewall of the fins. In the exemplary embodiment depicted in FIG. 5B, the impurity source film 215 is deposited conformally over a fin sidewall 201A, over a fin top surface 201B, and over intervening surfaces of substrate 205. The deposition technique may depend on the composition of impurity source film 215, with exemplary techniques including chemical vapor deposition (CVD), atomic layer deposition (ALD) and physical vapor deposition (PVD). The impurity source film deposited at operation 415 may further have any of the compositions and thickness previously described with 1-5 nm of PSG having a phosphorus doping of $10^{20}$-$10^{21}$ cm$^{-3}$ being one specific exemplary embodiment.

Figure 5C:
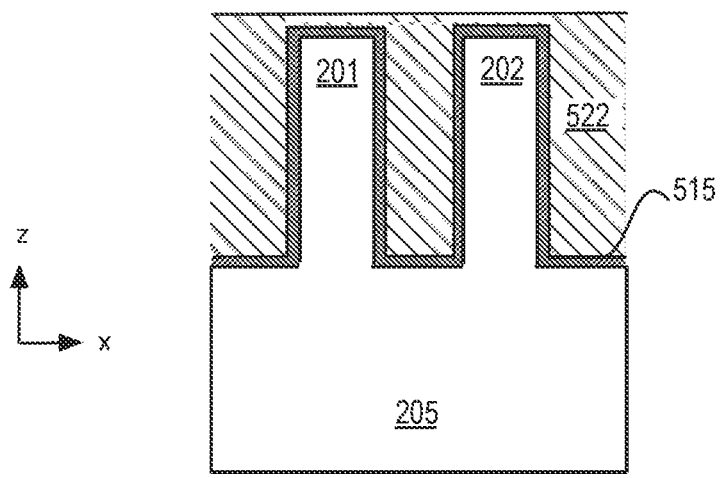
Figure 5D:
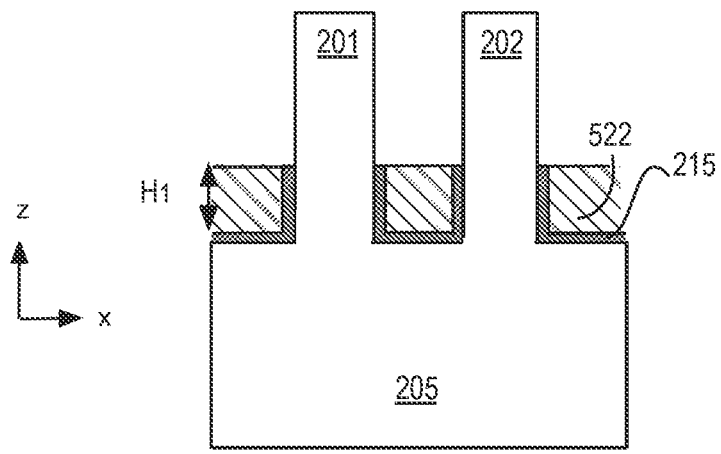

Returning to FIG. 4, method 401 proceeds to operation 420 where an etch mask is deposited and recessed over the first impurity source film to protect the film adjacent to only a lower portion of the sub-fin region. FIG. 5C illustrates an exemplary etch mask 522 that is applied so as to be planarized at a level above fins 201, 202. In one advantageous embodiment, etch mask 522 is any conventional photoresist applied by conventional techniques. Etch mask 522 may be other materials, or include one or more other materials, such as, but not limited to, an amorphous, or "diamond-like" carbon hardmask. After application of the etch mask, the etch mask may be optionally patterned by conventional techniques to remove the entire thickness of the etch mask in regions of the substrate where a substrate isolation doping of fins is not needed and/or desired. For example, a photoresist etch mask may be lithographically patterned to selectively remove areas of the etch mask from portions of the substrate. Whether optionally patterned or in blanket form, the etch mask is then recessed selectively relative to the semiconductor fins, or an intervening etch stop layer, so that the mask then protects the underlying impurity source film only in regions adjacent to the lower sub-fin region that is to be subsequently doped by the impurity source film. FIG. 5D further depicts an exemplary embodiment where the mask 522 is etched (developed) back by a dry or wet chemical process to a desired mask thickness corresponding to the fin sidewall height $H_1$.

Returning to FIG. 4, at operation 425 a portion of the impurity source film not protected by the etch mask is removed selectively relative to the semiconductor fins and interfacial (etch-stop) layer. Any conventional etch may be employed at operation 425 depending on the impurity source film composition. In the exemplary embodiment where the impurity source film is PSG, any conventional wet or dry dielectric etch with high selectivity to semiconductor may be utilized to arrive at the structure depicted in FIG. 5D. Any regions where etch mask 522 was completely removed from a fin sidewall (e.g., by patterning the etch mask to unmask the first impurity source film adjacent to an upper and lower portion of a second sub-fin region of a second fin), impurity source film 215 would be completely removed from the entire sub-fin region. Although, semiconductor surfaces of fins 201, 202 are exposed by the etching of impurity source film 215 in the exemplary embodiment, an intervening etch stop layer may be exposed instead in the event that impurity source film 215 is not disposed directly on fins 201, 202.

Figure 5E:
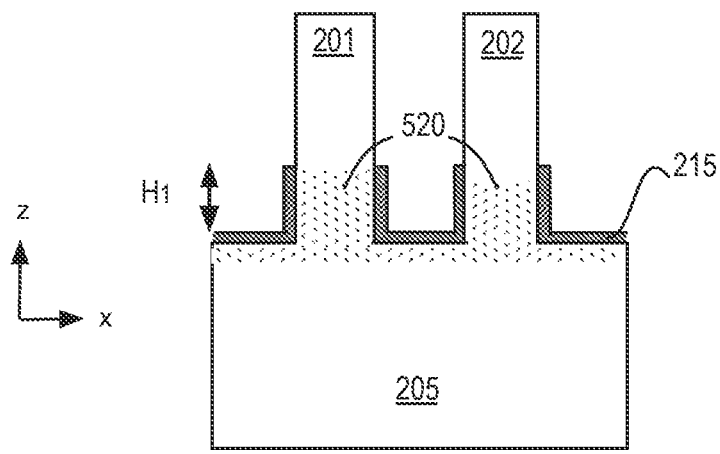
Figure 5F:
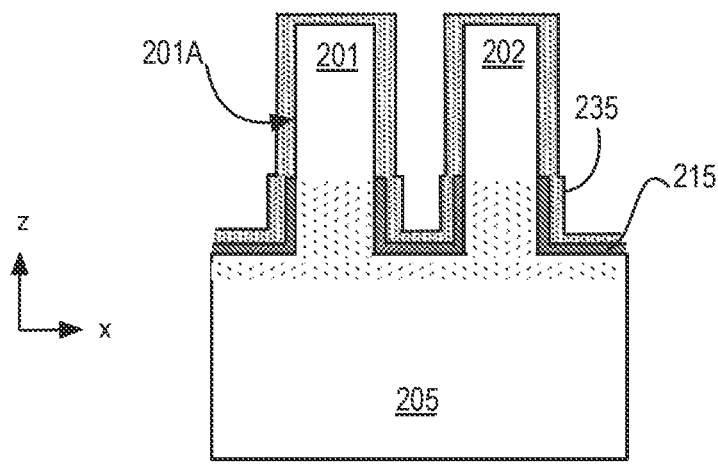
Figure 5G:
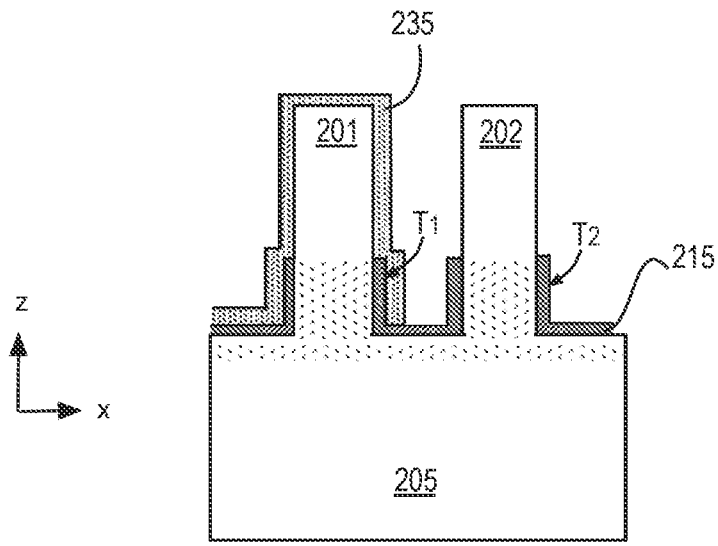
Figure 5H:
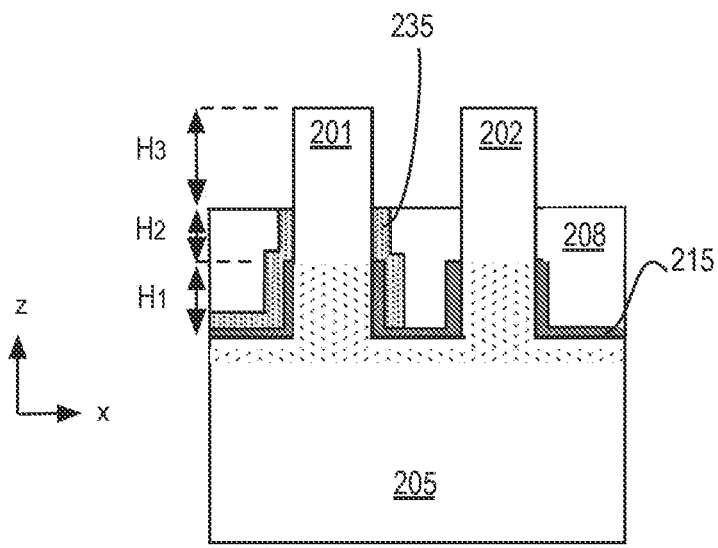

Method 401 may then proceed to operation 430 where an optional pre-drive is performed. If performed, the impurities in the impurity source film are driven into the lower portion of the sub-fin region. Temperature and time parameters may be selected based on various factors, such as, but not limited to, fin width, desired fin dopant concentration, and impurity mobility within the impurity source film and/or semiconductor fin. An exemplary temperature range is 700-1100 C and an exemplary time range is a few seconds to a few minutes for an exemplary fin width that is less than 30 nm. The effects of such a pre-drive are illustrated in FIG. 5E, where dopants 520 are illustrated as having entered the lower portion of the sub-fin region most proximate to impurity source film 215, as well as into proximate regions of substrate 205.

Following the pre-drive, or where no pre-drive operation is performed, method 401 proceeds to operation 435 where a second impurity source film is deposited over a sidewall of the fins. In the exemplary embodiment depicted in FIG. 5F, impurity source film 235 is deposited conformally over fins 201, 202 as well as over impurity source film 215 (if present). For fins where impurity source film 215 had been previously completely removed, impurity source film 235 may be in contact with the entire sidewall height of the fin (e.g., $H_{fin}$). The deposition technique employed at operation 435 may again depend on the composition of impurity source film 235, with exemplary techniques including CVD, ALD, and PVD. Impurity source film 235 deposited at operation 435 may further have any of the compositions and thickness previously described with 1-5 nm of BSG having a boron doping of $10^{20}$-$10^{21}$ cm$^{-3}$ being one specific exemplary embodiment.

Method 401 proceeds with masking at least one fin at operation 440 and removing the exposed portion of the second Impurity source film. Any conventional photoresist etch mask, photolithographic patterning of the etch mask, and subsequent etching of the underlying impurity film may be performed at operation 440. As further depicted in FIG. 5G, a portion of retained impurity source film 235 may be disposed over impurity source film 215 having the thickness $T_1$ while removal of the impurity source film 235 in other regions reduces the thickness of impurity source film 215 to a second thickness $T_2$, as a function of the etch selectivity between the two impurity source films 235, 215. For the exemplary embodiment where impurity source film 235 is BSG and impurity source film 215 is PSG, etch selectivity may be made very high with proper choice of etchant chemistry so the difference between $T_1$ and $T_2$ may be only a few nm, or may even be imperceptible. A greater distinction between $T_1$ and $T_2$ may be visible for other material systems and/or removal processes. For fins where impurity source film 215 had been previously completely removed, impurity source film 235 may be also completely removed from the fin semiconductor.

Returning to FIG. 4, at operation 450 isolation dielectric is formed over any impurity source films present (e.g., the first and second impurity source films formed at operations 415 and 435). Isolation dielectric may be formed through any conventional techniques, for example with a gap filling dielectric deposition process and planarization polish, etc. At operation 455, the isolation dielectric is then recessed selectively to the semiconductor fins and/or an intervening stop layer to define an active region of the fins. Any conventional isolation recess process may be utilized to achieve the intermediate structure shown in FIG. 5H where fins 201, 202 have active regions extending a sidewall height $H_3$ from a top surface of isolation dielectric 208. In conjunction with the sidewall height $H_1$ as was defined by the etch mask recessing that was performed at operation 420, the exposed surface of isolation dielectric 208 further defines a sidewall height $H_2$ over which impurity source film 235 (if present) is adjacent to an upper portion of the sub-fin region. Where both impurity source films 215, 235 had been previously completely removed, recessing of isolation dielectric 208 defines the active region from a sub-fin region that is to have substantially the same impurity doping as the substrate. Where impurity source film 235 was retained, but impurity source film 215 was removed, recessing of isolation dielectric 208 defines the active region from a sub-fin region that is to have a homogeneous doping of the impurity in impurity source film 235.

Figure 5I:
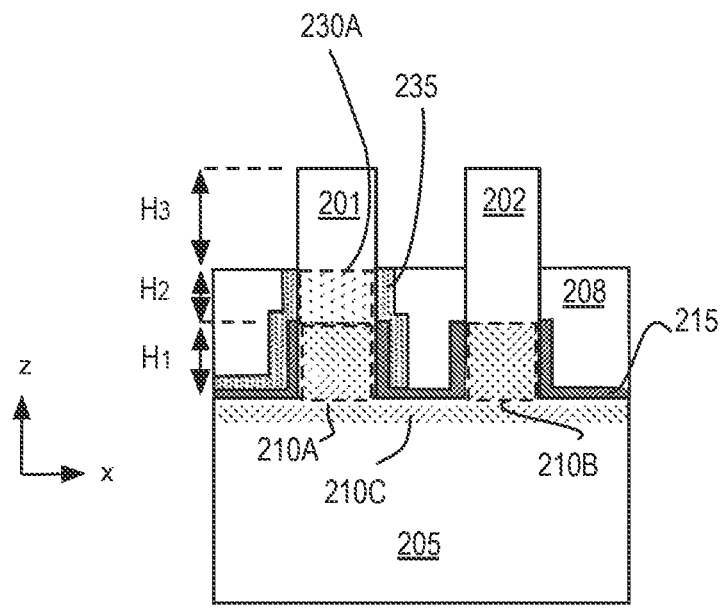
Figure 5J:
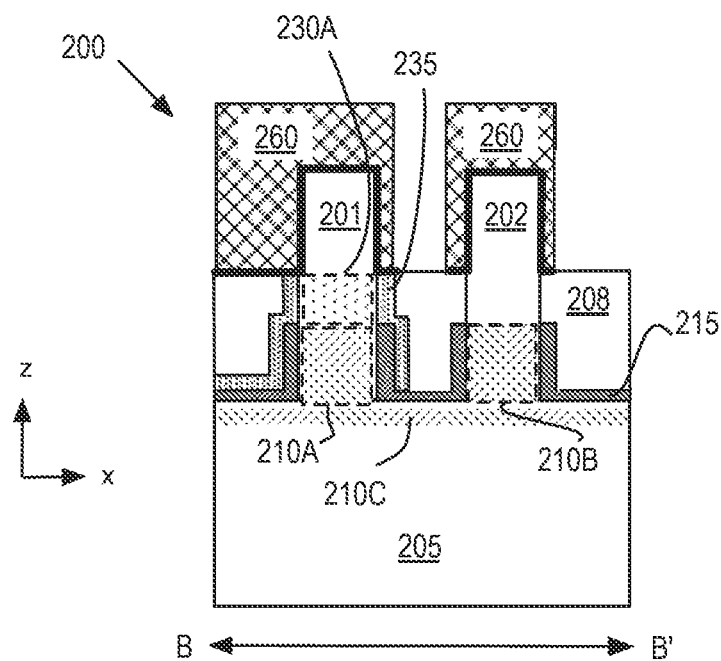

Continuing at operation 460 (FIG. 4) with the sub-fin and active regions now defined, impurities from impurity source films are driven into distinct portions of the fin most proximate to the impurity source films. Operation 460 may entail any elevated temperature process known in the art to be suitable to enhance diffusion of dopants from the source film(s) into the adjacent semiconductor. Temperature and time parameters may be selected based on various factors, such as, but not limited to, fin width, desired fin doping concentration, whether pre-drive operation 430 had been previously performed, and impurity mobility within the impurity source film(s) and/or semiconductor fin. An exemplary temperature range is 700-1100 C and an exemplary time range is a few seconds to a few minutes for an exemplary fin width that is less than 30 nm. As shown in FIG. 5I, the drive operation 460 dopes upper sub-fin region 230A with a second impurity. Where multiple impurity source films are adjacent to distinct portions of the sub-fin region the drive operation 460 dopes the distinct portions of the sub-fin region with impurities from the various localized impurity source films. For example, where impurity source film 215 is PSG and impurity source film 235 is BSG, the upper sub-fin region is doped to a conductivity type complementary to that of the lower sub-fin region 210A.

Method 401 then completes with conventional transistor fabrication operations, such as, but not limited to forming a gate stack and a source/drain for each active region of the fins, and interconnecting the gate stacks and source/drains, for example to form CMOS circuitry using one or more of substrate-isolated or non-substrate-isolated fin structures. In the exemplary embodiment depicted in FIG. 5J, formation of the gate stack 260 and source/drains arrives at the structure 200, possessing one or more of the features previously described elsewhere herein in the context of FIGS. 2A-2D.

Figure 6:
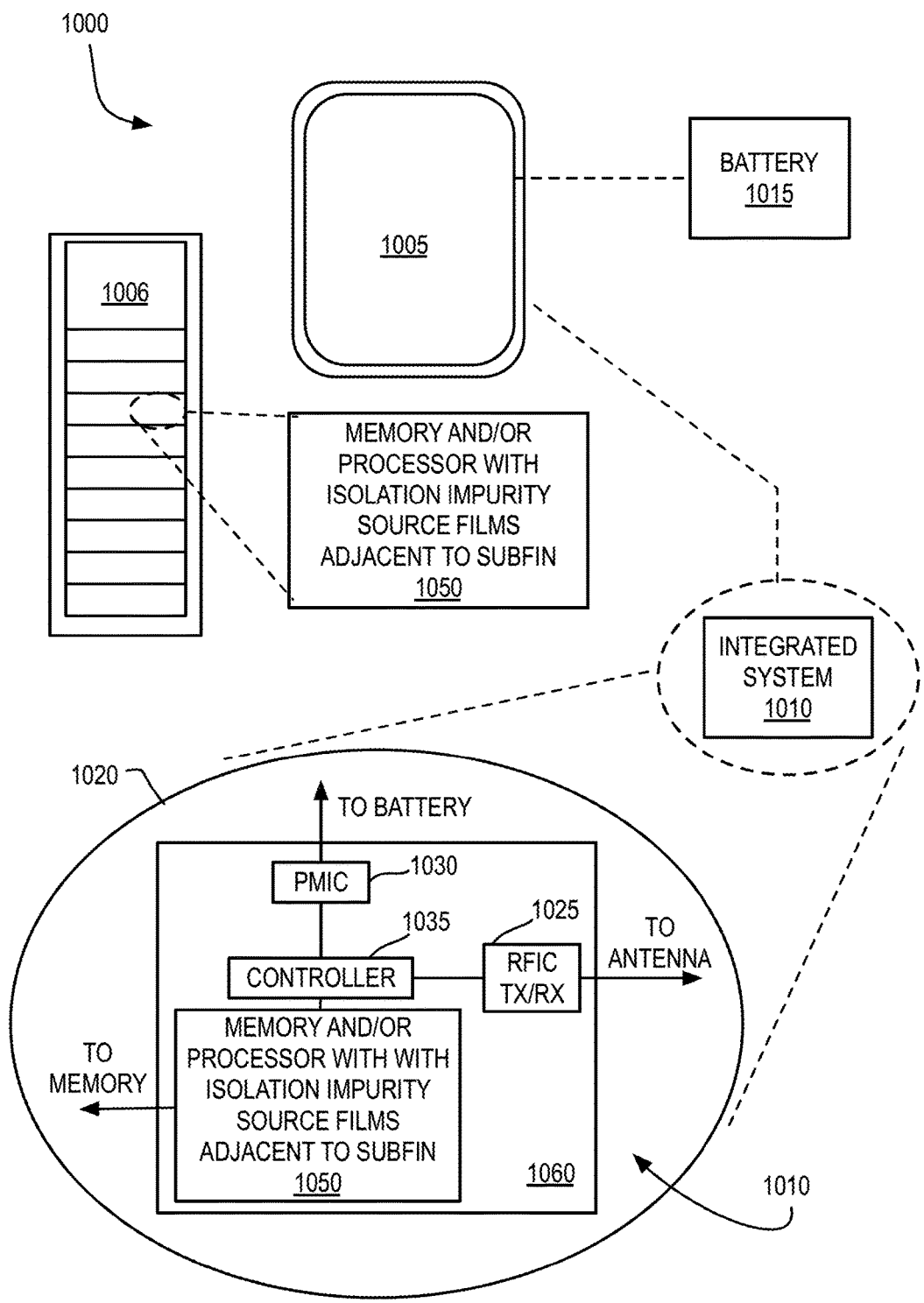
FIG. 6 illustrates a mobile computing platform and a data server machine employing a monolithic IC with isolation impurity source films adjacent to a portion of a sub-fin region of a finFET, in accordance with embodiments of the present invention.

FIG. 6 illustrates a system 1000 in which a mobile computing platform 1005 and/or a data server machine 1006 employs a monolithic IC with impurity source films adjacent to impurity doped sub-fin regions, in accordance with embodiments of the present invention. The server machine 1006 may be any commercial server, for example including any number of high performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a monolithic architecture with at least one finFET having an impurity doped sub-fin region adjacent to an impurity source film, and advantageously includes a SoC architecture with at least one finFET having a substrate isolation doped lower sub-fin region and at least one other finFET having a lower sub-fin region without such isolation doping. The monolithic IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 7:
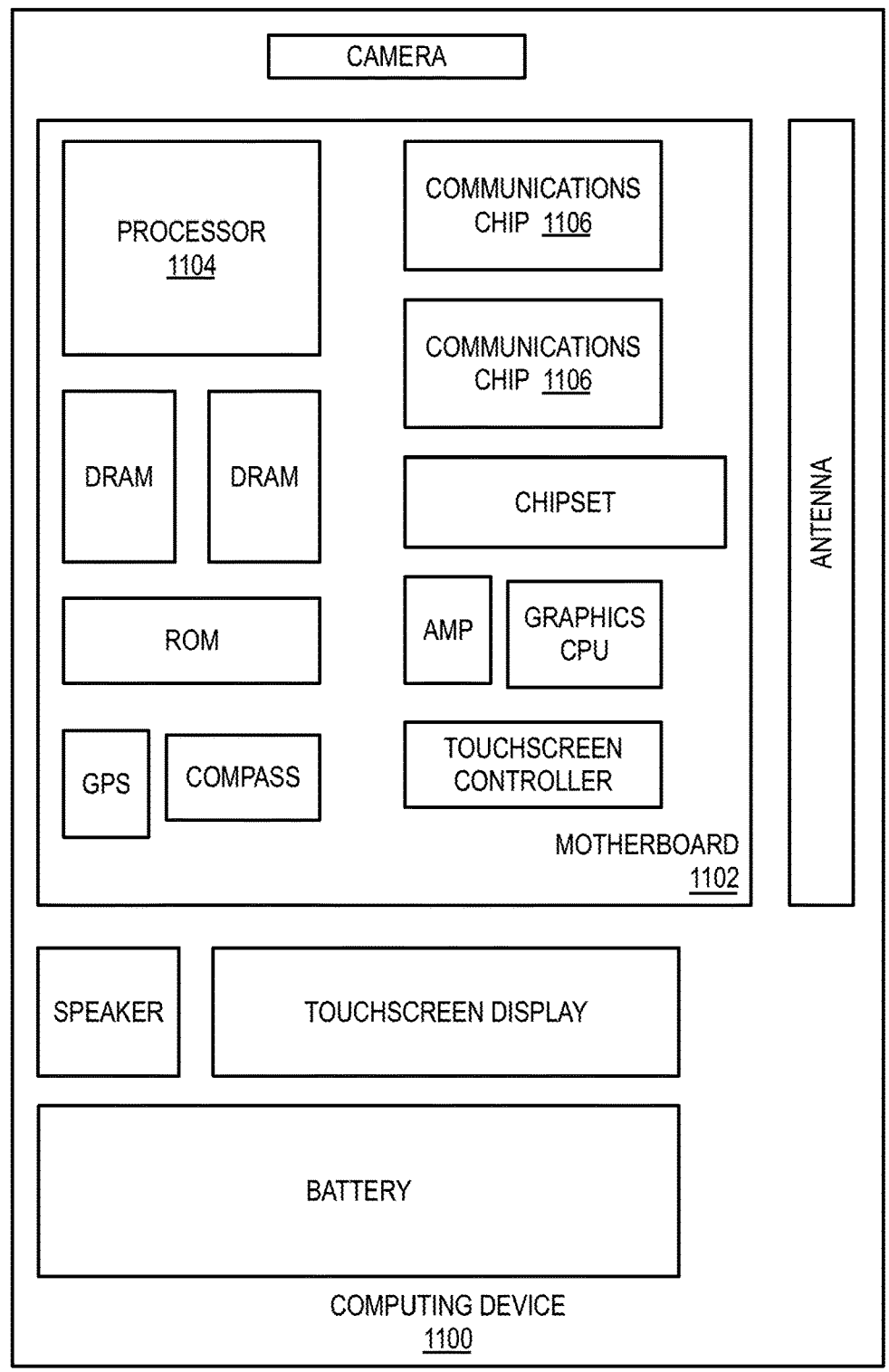
FIG. 7 is a functional block diagram of an electronic computing device, in accordance with an embodiment of the present invention.

FIG. 7 is a functional block diagram of a computing device 1100, arranged in accordance with at least some implementations of the present disclosure. Computing device 1100 may be found inside platform 1005 or server machine 1006, for example, and further includes a motherboard 1102 hosting a number of components, such as but not limited to a processor 1104 (e.g., an applications processor), which may incorporate local inter-level interconnects as discussed herein, and at least one communication chip 1106. In embodiments, at least one of the processor 1104 one or more communication chips 1106, or the like. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combination of features.

In one exemplary embodiment, an integrated microelectronic device comprises a substrate. A first transistor including a non-planar semiconductor fin extends from the substrate. The fin has a sub-fin region disposed between an active region of the fin and the substrate, wherein the sub-fin region further comprises a lower sub-fin region proximate to the substrate and an upper sub-fin region proximate to the active region. A first impurity source film is disposed adjacent to a sidewall surface of the lower sub-fin region, but is absent from the upper sub-fin region. The first impurity source film is doped with an impurity present in the lower sub-fin region. A gate stack is disposed adjacent to a sidewall surface of the active region.

In a further embodiment, the device further comprises a dielectric disposed over the first impurity source film and adjacent to a sidewall surface of the upper sub-fin region. The isolation dielectric is substantially free of the impurity present in the first impurity source film.

In a further embodiment, the device further comprises a second impurity source film that comprises a second impurity and is disposed over the first impurity source film and is adjacent to a sidewall surface of the upper sub-fin region. The upper sub-fin region is doped with the second impurity to have a conductivity type complementary to that of the lower sub-fin region.

In a further embodiment, the device further comprises a second impurity source film comprising a second impurity and is disposed over the first impurity source film and adjacent to a sidewall surface of the upper sub-fin region. The upper sub-fin region is doped with the second impurity to have a conductivity type complementary to that of the lower sub-fin region. A second transistor including a second non-planar semiconductor fin extends from the substrate, the second fin has a second sub-fin region disposed between a second active region of the second fin and the substrate. The second sub-fin region further comprises a second lower sub-fin region proximate to the substrate and a second upper sub-fin region proximate to the second active region. The first impurity source film is further disposed adjacent to a sidewall surface of the second lower sub-fin region, but is absent from the second upper sub-fin region. An isolation dielectric is disposed over the first impurity source film and adjacent to a sidewall surface of the second upper sub-fin region. The isolation dielectric is substantially free of the impurities present in the first or second impurity source films.

In further embodiments, for any of the device embodiments described above, the lower sub-fin region has an impurity doping distinct from that of the upper sub-fin region and the first impurity source film comprises the impurity of the lower sub-fin region.

In further embodiments, for any of the device embodiments described above, the lower sub-fin region is doped with the impurity to have a conductivity type complementary to that of the substrate.

In further embodiments, for any of the device embodiments described above, the upper sub-fin region has an impurity doping distinct from both the lower sub-fin region and the active fin region.

In further embodiments, for any of the device embodiments described above, the upper sub-fin region has an impurity doping complementary to the lower sub-fin region.

In further embodiments, for any of the device embodiments described above, the first fin has a lateral width less than 20 nm, extends up from the substrate by 20-150 nm. The first impurity source film comprises a silicate glass film having a thickness between 1 nm and 7 nm. The lower sub-fin region has a dopant concentration between $10^{17}$ cm$^{-3}$ and $10^{19}$ cm$^{-3}$.

In further embodiments, for any of the device embodiments described above, a third transistor including a third non-planar semiconductor fin extending from the substrate. The third fin has a third sub-fin region disposed between a third active region of the third fin and the substrate. The third sub-fin region further comprises a third lower sub-fin region proximate to the substrate and a third upper sub-fin region proximate to the third active region. The first impurity source film is absent from sidewall surfaces of the third lower sub-fin region and third upper sub-fin region. A second impurity source film is further disposed adjacent to a sidewall surface of the upper sub-fin region.

In further embodiments, a device includes a second impurity source film comprising second impurity source film disposed over the first impurity source film and adjacent to a sidewall surface of the upper sub-fin region. The upper sub-fin region is doped with boron. A second transistor includes a second non-planar semiconductor fin extending from the substrate, the second fin having a second sub-fin region disposed between a second active region of the second fin and the substrate. The second sub-fin region further comprises a second lower sub-fin region proximate to the substrate and a second upper sub-fin region proximate to the second active region. The first impurity source film is further disposed adjacent to a sidewall surface of the second lower sub-fin region and absent from the second upper sub-fin region. An isolation dielectric is disposed over the first impurity source film and adjacent to a sidewall surface of the second upper sub-fin region. The isolation dielectric is substantially free of the impurities present in the first or second impurity source films. A second gate stack is disposed adjacent to a sidewall surface of the second active region, over the isolation dielectric. A third transistor includes a third non-planar semiconductor fin extending from the substrate. The third fin has a third sub-fin region disposed between a third active region of the third fin and the substrate. The first impurity source film is absent from sidewall surfaces of the third sub-fin region. A second impurity source film is further disposed adjacent to a sidewall surface of the third sub-fin region. A third gate stack is disposed adjacent to a sidewall surface of the third active region. The first and third transistors are NMOS transistors and the second transistor is a PMOS transistor. The first and second impurity source films each comprise a doped silicate glass. The first and second lower sub-fin regions are doped n-type. A surface layer in a first region of the substrate separating the first and second lower sub-fin regions is doped n-type. A sub-surface region of the substrate disposed below the surface layer in the first region, and a surface layer in a second region of the substrate separating the third sub-fin region from the first and second lower sub-fin regions, are doped p-type.

In embodiments a mobile computing platform, comprises the device of any of exemplary embodiments above, a display screen communicatively coupled to the device, and a wireless transceiver communicatively coupled to the device.

In embodiments, a method of fabricating an integrated microelectronic device comprises receiving a non-planar semiconductor fin, forming an impurity source film, forming a second film over the impurity source film, driving dopants from the impurity source film, and forming a gate stack and a source/drain. The non-planar semiconductor fin is formed extending from a substrate, with a sub-fin region disposed between an active region of the fin and the substrate. The impurity source film is formed adjacent to a sidewall of a lower portion of the sub-fin region proximate to the substrate. The second film is formed over the impurity source film and adjacent to a sidewall of an upper portion of the sub-fin region proximate to the active region. The dopants are driven from the impurity source film into the lower portion of the sub-fin region. The gate stack and a source/drain are formed over the active region.

In further embodiments, forming the impurity source film further comprises depositing the impurity source film over a sidewall the fin, forming and recessing an etch mask over the impurity source film to protect the impurity source film adjacent to the lower portion of the sub-fin region, and removing an unmasked portion of the first impurity source film prior to the driving.

In further embodiments, forming the second film over the impurity source film further comprises forming a second impurity source film comprising a second impurity over the first impurity source film and adjacent to a sidewall surface of the upper sub-fin region. The driving dopes the upper sub-fin region with the second impurity to have a conductivity type complementary to that of the lower sub-fin region.

In further embodiments, receiving a non-planar semiconductor fin extending from a substrate further comprises receiving a plurality of non-planar semiconductor fins, the fins each having a sub-fin region disposed between an active region of the fin and the substrate. In these embodiments, forming a second impurity source film further comprises depositing a second impurity source film over a sidewall of the plurality of fins. At least one of the fins is then masked. An unmasked portion of the second impurity source film is removed. An isolation dielectric is formed over the first and second impurity source films. The isolation dielectric and second impurity source film is recessed to expose the active fin region. The driving dopes portions of the sub-fin regions with impurities from first and second impurity source films.

In further embodiments, the impurity source film dopes the lower sub-fin region to have a conductivity type complementary to that of the substrate.

In any of the above exemplary embodiments, receiving a non-planar semiconductor fin extending from a substrate further comprises receiving a plurality of non-planar semiconductor fins, the fins each having a sub-fin region disposed between an active region of the fin and the substrate. Forming and recessing the etch mask over the impurity source film further comprises patterning the etch mask to unmask the first impurity source film adjacent to an upper and lower portion of a second sub-fin region of a second fin, and removing the unmasked portion of the first impurity source film prior to the driving.

Exemplary embodiments further include a method of forming a system on a chip (SoC). A plurality of non-planar semiconductor fins extending from a substrate are received, each fin having a sub-fin region disposed between an active region of the fin and the substrate. Fins in a first region of the substrate are electrically isolated from fins in a second region of the substrate, by depositing a first impurity source film over a sidewall the fins. A first etch mask is deposited over the first impurity source film. The first etch mask is patterned to protect the first impurity source film adjacent to the first and second fins and expose the first impurity source film adjacent to the third fin. The patterned first etch mask is recessed to protect only the impurity source film adjacent to a lower portion of the sub-fin region. The unmasked portions of the first impurity source film is removed. Impurities are driven from the first impurity source film into the lower portion of the sub-fin regions. A complementary well is formed in a portion of the first substrate region, by depositing a second impurity source film over a sidewall of the plurality of fins. A second etch mask is patterned to protect the second impurity source film adjacent to the first fin and expose the second impurity source film adjacent to the second fin. Unmasked portions of the second impurity source film are removed. An isolation dielectric is formed over the first and second impurity source films. The isolation dielectric and second impurity source film are recessed to expose active regions of the fins. Impurities are driven from the second impurity source film into an upper portion of the sub-fin region. CMOS circuitry is fabricated within the first and second substrate regions by forming a gate stack and a source/drain for each active region of the fins, and interconnecting the gate stacks and source/drains.

In further embodiments, a complementary well is formed in a portion of the second substrate region by patterning the second etch mask to protect the second impurity source film adjacent to the third fin.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated microelectronic device comprising:
a substrate;
a transistor including a non-planar semiconductor fin extending from the substrate, the fin having a sub-fin region between an active region of the fin and the substrate, wherein the sub-fin region further comprises a lower sub-fin region proximate to the substrate and an upper sub-fin region proximate to the active region;
an impurity source film adjacent to a sidewall surface of the lower sub-fin region and absent from a sidewall surface of the upper sub-fin region, wherein the impurity source film comprises an impurity present in the lower sub-fin region; and
a gate stack adjacent to a sidewall surface of the active region, wherein the gate stack comprises a gate dielectric and a gate electrode.

2. The device of claim 1, further comprising an isolation dielectric over the impurity source film and adjacent to a sidewall surface of the upper sub-fin region, wherein the isolation dielectric is substantially free of the impurity present in the impurity source film.

3. The device of claim 1, further comprising:
a second impurity source film comprising a second impurity, the second impurity source film over the impurity source film and adjacent to the sidewall surface of the upper sub-fin region, wherein the upper sub-fin region comprises the second impurity and has a conductivity type complementary to that of the lower sub-fin region.

4. The device of claim 1, further comprising:
a second impurity source film comprising a second impurity, the second impurity source film over the impurity source film and adjacent to a sidewall surface of the upper sub-fin region, wherein the upper sub-fin region comprises the second impurity and has a conductivity type complementary to that of the lower sub-fin region; and
a second transistor including a second non-planar semiconductor fin extending from the substrate, the second fin having a second sub-fin region between a second active region of the second fin and the substrate, wherein the second sub-fin region further comprises a second lower sub-fin region proximate to the substrate and a second upper sub-fin region proximate to the second active region, wherein the impurity source film is adjacent to a sidewall surface of the second lower sub-fin region and is absent from the second upper sub-fin region, and an isolation dielectric is over the impurity source film and adjacent to a sidewall surface of the second upper sub-fin region, wherein the isolation dielectric, as deposited, is substantially free of the impurities present in the impurity source film or the second impurity source film.

5. The device of claim 1, wherein the lower sub-fin region comprises an impurity distinct from that of the upper sub-fin region.

6. The device of claim 1, wherein the impurity in the lower sub-fin region induces a conductivity type in the lower sub-fin region that is complementary to that of the substrate.

7. The device of claim 1, wherein the upper sub-fin region comprises an impurity distinct from both the lower sub-fin region and the active region.

8. The device of claim 1, wherein the upper sub-fin region comprises an impurity complementary to the lower sub-fin region.

9. The device of claim 1, wherein:
the fin has a lateral width less than 20 nm, and extends up from the substrate by 20-150 nm;
the impurity source film comprises a silicate glass film having a thickness between 1 nm and 7 nm; and
the impurity within the lower sub-fin region has a concentration between $10^{17}$ cm$^{-3}$ and $10^{19}$ cm$^3$.

10. The device of claim 4, further comprising:

a third transistor including a third non-planar semiconductor fin extending from the substrate, the third fin having a third sub-fin region between a third active region of the third fin and the substrate, wherein the third sub-fin region further comprises a third lower sub-fin region proximate to the substrate and a third upper sub-fin region proximate to the third active region, and wherein the impurity source film is absent from sidewall surfaces of the third lower sub-fin region and third upper sub-fin region.

11. The device of claim 1, further comprising:

a second impurity source film comprising a second impurity, the second impurity source film over the impurity source film and adjacent to a sidewall surface of the upper sub-fin region, wherein the upper sub-fin region comprises the second impurity;

a second transistor including a second non-planar semiconductor fin extending from the substrate, the second fin having a second sub-fin region between a second active region of the second fin and the substrate, wherein:

the second sub-fin region further comprises a second lower sub-fin region proximate to the substrate and a second upper sub-fin region proximate to the second active region;

the impurity source film is adjacent to a sidewall surface of the second lower sub-fin region and absent from the second upper sub-fin region;

an isolation dielectric material is over the impurity source film and adjacent to a sidewall surface of the second upper sub-fin region, wherein the isolation-dielectric is substantially free of the impurities present in the impurity source film or the second impurity source film; and a second gate stack adjacent to a sidewall surface of the second active region, wherein the second gate stack comprises a gate dielectric and a gate electrode that are above the isolation dielectric;

a third transistor including a third non-planar semiconductor fin extending from the substrate, the third fin having a third sub-fin region between a third active region of the third fin and the substrate, wherein:

the impurity source film is absent from sidewall surfaces of the third sub-fin region;

the second impurity source film is adjacent to a sidewall surface of the third sub-fin region; and a third gate stack is adjacent to a sidewall surface of the third active region, wherein:

the impurity source film and the second impurity source film each comprise a silicate glass;

the lower sub-fin region and the second lower sub-fin region is n-type;

a surface layer in a first region of the substrate separating the lower sub-fin region from the second lower sub-fin region is n-type; and a sub-surface region of the substrate below the surface layer in the first region, and a surface layer in a second region of the substrate separating the third sub-fin region from the sub-fin region and the second lower sub-fin region, is p-type.

12. The device of claim 1, wherein:

the impurity source film comprises a phosphorus-doped silicate glass (PSG); and the impurity is phosphorus.

13. The device of claim 1, wherein:

the active region has a lateral width less than 20 nm;

the fin has a vertical height of between 20 nm and 150 nm; and the impurity source film has a thickness between 1 nm and 5 nm as measured normal to the sidewall surface.

14. The device of claim 3, wherein:

at least one of the impurity source film and the second impurity source film comprises a phosphorus-doped silicate glass (PSG); and the impurity is phosphorus.

15. The device of claim 4, wherein the isolation dielectric comprises a plurality of dielectric material layers including a silicon nitride layer that is adjacent to the impurity source film, and adjacent to the second impurity source film.

16. The device of claim 4, wherein:

the impurity source film comprises a phosphorus-doped silicate glass (PSG);

the fin is associated with a PMOS transistor;

the second impurity source film comprises a boron-doped silicate glass (BSG); and the second fin is associated with an NMOS transistor.

17. The device of claim 8, wherein:

the impurity source film and the second impurity source film are layers within a stack of layers that is adjacent to a sidewall surface of the lower sub-fin region of the second fin.

18. The structure of claim 17, wherein the stack of layers further comprises a silicon nitride layer between the impurity source film and the second impurity source film.

* * * * *